(12) United States Patent
Eshraghi et al.

(10) Patent No.: US 6,462,687 B1
(45) Date of Patent: Oct. 8, 2002

(54) HIGH PERFORMANCE DELTA SIGMA ADC USING A FEEDBACK NRZ SIN DAC

(75) Inventors: Aria Eshraghi, Woburn, MA (US); Ramkishore Ganti, Ossining, NY (US); Weinan Gao, Littleton, MA (US)

(73) Assignee: International Business Machines Corporatiom, Armonk, NY (US)

( * ) Notice: Subject to any disclaimer, the term of this patent is extended or adjusted under 35 U.S.C. 154(b) by 0 days.

(21) Appl. No.: 09/824,566

(22) Filed: Apr. 3, 2001

(51) Int. Cl.[7] .............................. H03M 3/00; H03M 7/12
(52) U.S. Cl. .......................................... 341/143; 341/69
(58) Field of Search .................................. 341/143, 144, 341/94, 118, 120, 68, 69; 73/504.13; 378/4; 375/272, 342, 375; 327/157; 360/41

(56) References Cited

U.S. PATENT DOCUMENTS

| | | | |
|---|---|---|---|
| 5,056,118 A | * 10/1991 | Sun | 375/342 |
| 5,528,239 A | 6/1996 | Swanson et al. | |
| 5,557,635 A | 9/1996 | Laird | |
| 5,610,606 A | * 3/1997 | Fukunaga et al. | 341/143 |
| 6,114,981 A | * 9/2000 | Nagata | 341/143 |
| 6,121,910 A | 9/2000 | Khoury et al. | |
| 6,324,236 B1 | * 11/2001 | Bladh | 375/375 |

OTHER PUBLICATIONS

W. Gao and W.M. Snelgrove, "A 950–MHz IF Second–Order Integrated LC Bandpass Delta–Sigma Modulator," May 1998, *IEEE Journal of Solid–State Circuits*, vol. 33, No. 5.

O. Shoaei and W.M. Snelgrove, "Design and Implementation of a Tunable 40 MHz–70MHz Gm–C Bandpass ΔΣ Modulator," Jul. 1997, *IEEE Transactions on Circuits and Systems—II: Analog and Digital Signal Processing*, vol. 44, No. 7.

* cited by examiner

*Primary Examiner*—Patrick Wamsley
(74) *Attorney, Agent, or Firm*—Connolly Bove Lodge & Hutz LLP; Joseph P. Abate

(57) ABSTRACT

A continuous time delta-sigma analog to digital converter is disclosed. A summing junction receives an input analog signal to be digitized and a feedback signal. A loop filter receives the combined signals from the summing junction, and a course analog to digital converter converts the combined signal to a multi-bit digital number. A sin DAC provides a feedback signal to the summing junction, by reconverting the multi-bit digital signal to an analog signal. The sin DAC produces a linear output signal having a reduced phase jitter, resulting in a lower noise floor for the multi-digital signal. The sin DAC may be an NRZ sin DAC which avoids stringent linearity requirements on the summing junction.

11 Claims, 6 Drawing Sheets

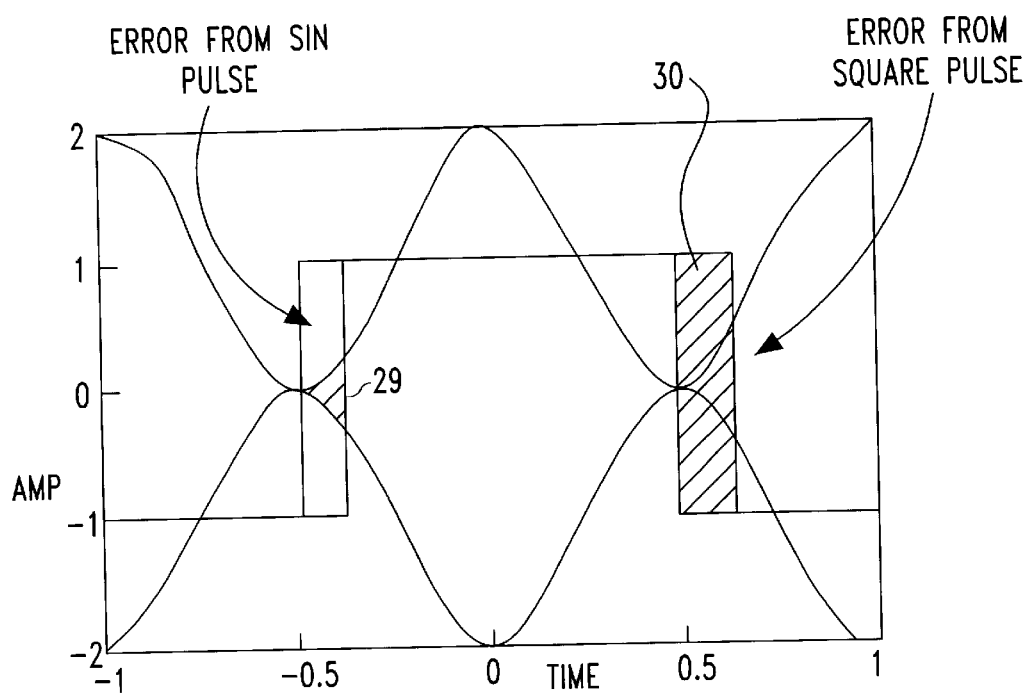
FIG. 5 PULSE SHAPING TO REDUCE THE ERROR DUE TO JITTER
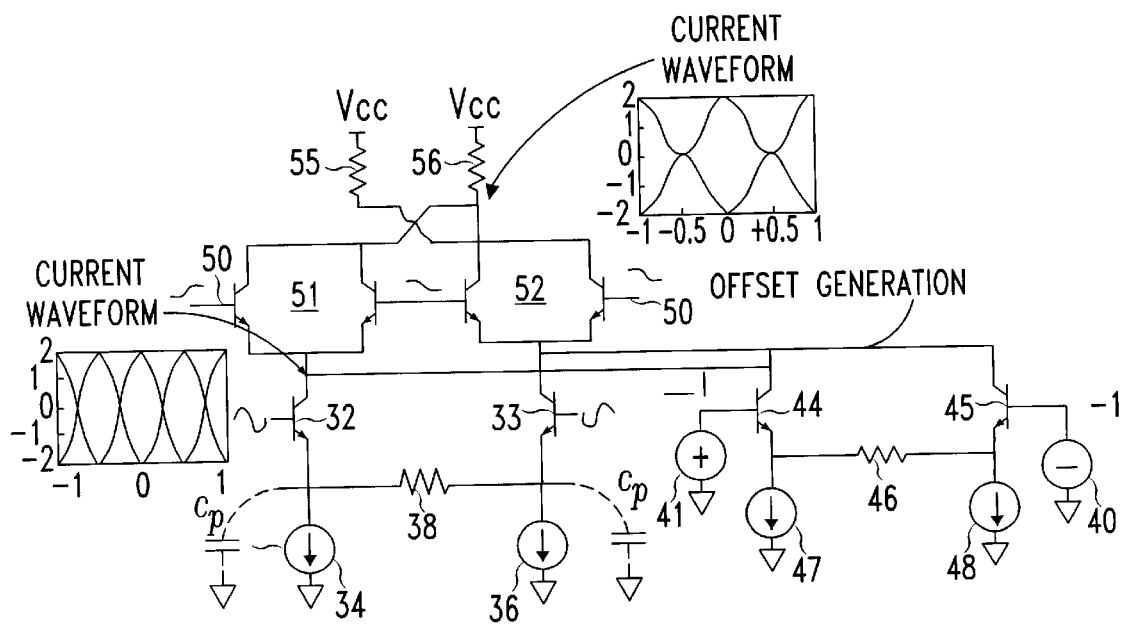
FIG. 6

HIGH PERFORMANCE DELTA SIGMA ADC USING A FEEDBACK NRZ SIN DAC

FIELD OF THE INVENTION

The present invention is directed to digital radio receivers which utilize analog to digital conversion of received analog signals. Specifically, a continuous time delta sigma analog to digital converter is disclosed for producing a high resolution digital signal having a low phase noise floor.

Digital radio receivers provide for enhanced signal processing by converting received analog radio signals into digital signals. Digital processing is very sophisticated, and through the use of various processing algorithms. distortions due to intersymbol interference can be significantly reduced.

In processing digital radio signals, the higher up in the frequency conversion chain that signals are digitized, the more dynamic range and resolution is required for the analog to digital converter. Broadband digitization must not generate noise or frequency artificats in the adjacent channels. At the same time, it is necessary to digitize the entire bandwidth imposing significant design contraints in terms of linearity and resolution on the analog to digital converter. One type of analog to digital converter which addresses these needs is the continuous time delta sigma analog to digital converter (CT delta-signal ADC). A CT delta-sigma ADC provides high resolution digitizing of an analog signal with a very high oversampling rate. Eighteen to twenty bits of resolution can be achieved if each analog signal being received is oversampled 128 to 256 times. These high resolutions are achieved by noise shaping the input signal through a loop filter, and then oversampling the filtered signal with an analog to digital converter (ADC). The CT delta sigma ADC requires a clock signal rate to achieve the required oversampling ratio. This approach works well for bandwidths in the 1 to 10 KHz range. As the bandwidth of the input signal increases from the 10 KHZ region to a higher 1 GHZ region, the clock rate must be correspondingly increased to achieve the same oversampling ratio. As the clock rate for sampling the incoming analog signal increases to above 1 GHZ, in order to sample a 30 MhZ bandwidth signal, the phase jitter increases the noise floor limiting the digital signal resolution.

A significant source of phase jitter occurs in the CT delta-sigma ADC feedback path. In conventional CT delta-sigma ADC architecture, an analog feedback signal is created by reconverting the digital signal to an analog signal. Phase jitter of the clock signal of the digital to analog converter creates a noise function which reduces the CT delta-sigma ADC resolution.

The design of the DAC introduces other significant problems for maintaining both linearity and a low phase noise contribution to the feedback signal. The DAC may either be a return to zero (RZ) DAC or a non return to zero (NRZ) DAC. Each of these approaches has their own problems. For instance, an RZ DAC output signal will have a higher frequency content than the NRZ DAC and a greater jitter problem. Additionally, the output of the DAC in the feedback loop does not track the input signal very well. A large error voltage is generated and the input summing junction which combines the feedback signal and input signal must have a high degree of linearity to avoid generating undesired frequency artifacts in the analog signal frequency bandwidth. The NRZ DAC, however, has a higher linearity problem than the RZ DAC given the fact that the amount of energy transferred to the output changes during a data transition. RZ DAC architecture has the benefit over NRZ architecture of transferring the same amount of energy irrespective of the data transitions. The present invention makes significant improvements in the CT delta-sigma ADC design to minimize these performance limitations.

SUMMARY OF THE INVENTION

In accordance with the invention, a continuous time (CT) delta-sigma analog to digital converter is provided. The CT delta-sigma ADC operates at a high oversampling rate to provide a high degree of resolution of an input analog signal. A summing junction receives the analog signal as well as a feedback signal, producing an error signal which is filtered and converted into a multi-bit digital signal. The feedback signal which is combined with the input analog signal is generated from a sin DAC which reconverts the multi-bit digital signal to an analog signal, producing a feedback signal having a reduced phase jitter and a correspondingly lower noise floor to the summing junction.

In carrying out the invention in accordance with a preferred embodiment, a NRZ sin DAC is utilized as the feedback DAC which voids a significant contribution of phase noise, and has a constant energy output substantially independent of the data transitions of the digital data. The NRZ DAC comprises first and second sin DACs which convert the digital data to a RZ analog signal. The RZ sin DAC signals are out of phase, and when combined, produce an NRZ signal output. The NRZ signal is provided as a feedback signal to the input summing junction. Thus, it is possible to achieve minimum phase noise contribution due to clock jitter, while at the same time avoiding the consequences of an RZ feedback signal which generates frequency artifacts due to the nonlinearity of the input summing junction.

DESCRIPTION OF THE DRAWINGS

FIG. 5 illustrates the respective energy produced from the sin DAC data transitions and the sampling clock phase jitter.

FIG. 6 is a schematic representation of the sin DAC.

DESCRIPTION OF THE PREFERRED EMBODIMENT

Figure 1:
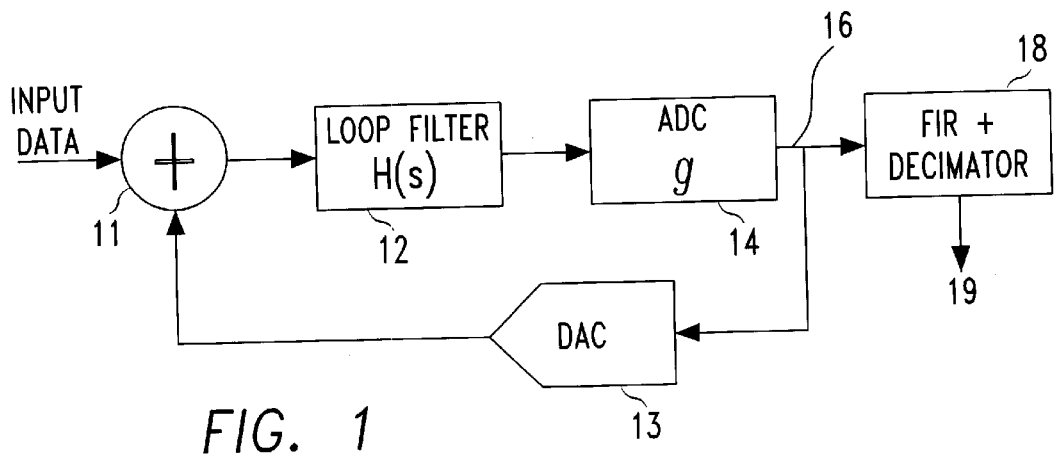
FIG. 1 illustrates a CT delta-sigma ADC for digitizing radio frequency signals.

Referring now to FIG. 1, a typical delta-sigma ADC is shown which is used to digitize radio frequency signals. An input analog signal is received on the summing junction 11 and is combined with a feedback signal to produce an error signal. A loop filter 12 is shown having a transfer function H(s), which for input signals centered around zero frequency, may be a low pass filter. In other embodiments of the invention, the filter 12 may have a bandpass characteristic to help shape the noise associated with the incoming signal when the input analog signal is centered around a carrier or subcarrier frequency. A coarse analog to digital converter (ADC) 14 is used to derive a multi-bit digital signal 16 which can be later decimated in a decimation circuit 18 to provide a higher resolution digital signal 19. A feedback DAC 13 generates the analog feedback signal which is combined in the summing circuit 11 to derive the error signal. The quantization noise produced by the course ADC 14 is shaped out of the band of interest by the loop filter 12.

Figure 2:
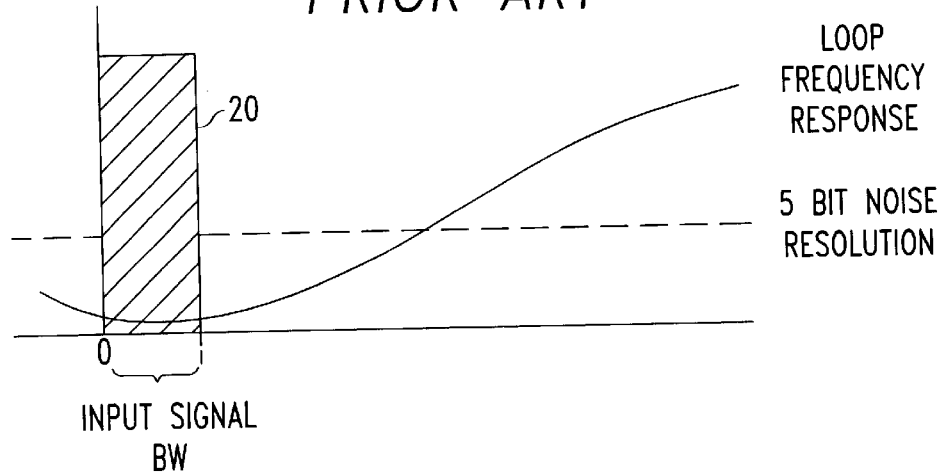
FIG. 2 illustrates the effect of noise shaping by the CT delta-sigma ADC of FIG. 1 to produce a low noise floor.

FIG. 2 illustrates the noise shaping that takes place by the CT delta-sigma ADC of FIG. 1. Referring now to FIG. 2, the frequency portion of the input signal which contains information to be recovered is designated as 20. This portion 20 of the frequency spectrum includes a noise floor which is shown for an ADC having a 5 bit output. The coarse ADC 14 provides oversampling of the input bandwidth signal 20 so that it is sampled at 128 to 256 times the signal bandwidth 20 represented in FIG. 2. The noise floor is lowered by the effects of the loop frequency response to the CT delta-sigma ADC, as shown in FIG. 2, permitting a significantly higher resolution signal to be recovered at the output of the coarse ADC 14. Accordingly, a decimation filter 18 may be used to increase the width of the digital signal to 18 bits since the lower shaped noise floor permits the higher degree of resolution.

Figure 3:
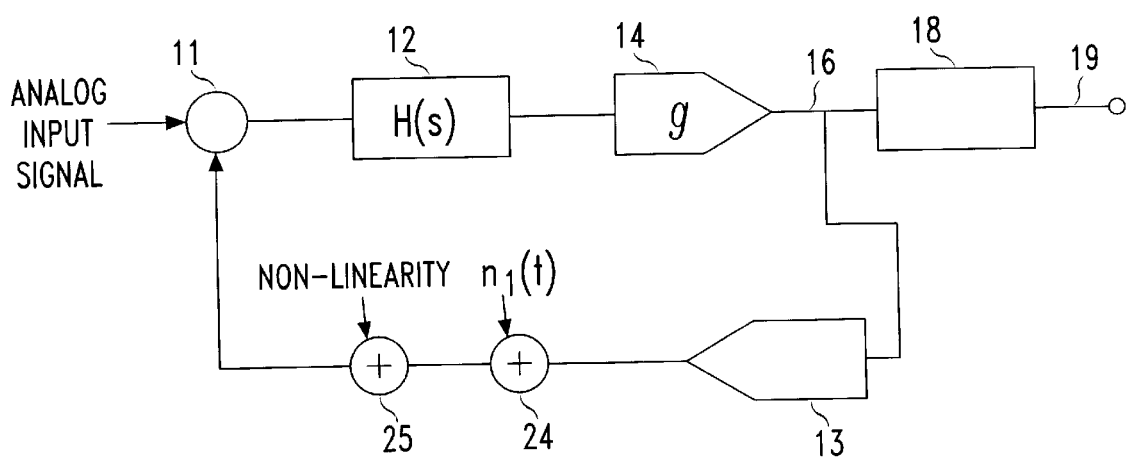
FIG. 3 illustrates the sources of phase noise and non-linearity effects due to the summing junction and DAC of FIG. 1.

FIG. 3 is a circuit model of the CT delta-sigma ADC of FIG. 1. The transfer function for the loop filter 12 is illustrated as H(s), and the transfer function for the coarse ADC 14 is given as g, the gain of the device (it being assumed it has no complex frequency response). The feedback DAC 13 is considered to be an ideal DAC having unity gain. The noise floor generated by the circuit of FIG. 1 is illustrated as a noise signal or $n_1(t)$ which is summed in a summing junction 24 with the feedback signal. Similarly, circuit nonlinearity effects for both the summing junction 11 and ideal feedback DAC 13 are shown combined with the feedback signal by summing junction 25.

The signal transfer function for the CT delta-sigma ADC is as follows:

$STF_{(s)}=(H(s)\times g)/1 +H(s)\times g \sim 1$ (in the passband of filter 12)

A similar noise transfer function may be described as follows:

$NTF(s)=1 /(1 +H(s)\times g)$

The above transfer functions illustrate how the filter response H(s) can be selected to lower the quantization noise in the band of interest without affecting the signal transfer function within the band.

The disadvantages of the foregoing CT delta-sigma ADC is a result of the clock jitter in the ideal DAC 13. The clock jitter is responsible for a significant portion of the noise floor $n_1(t)$ which can not be removed by the CT delta-sigma ADC loop response. Further, the nonlinearity of the feedback DAC 13 results in a feedback voltage to the summing junction 11 which does not track the input signal very well, resulting in a large error voltage. The large error voltage in turn can create frequency artifacts within the signal bandwidth if the summing junction 11 does not have a high linearity.

The noise jitter of the clock signal used in the feedback DAC 13 increases as the oversampling rate of the coarse ADC 14 increases. Thus, for signals having a bandwidth shown in FIG. 2 of 30 MhZ or higher, the phase noise from DAC 13 is not shaped, and contributes directly to the output noise of the CT delta sigma ADC. The phase jitter produced from the clock signal on the input data received by the feedback DAC 13 establishes a noise floor on the recovered digital signal 16.The clock signal phase jitter for the digital signal received by feedback DAC 13 would have to be less than 0.1 pico seconds, for a clock rate of 1 GHZ to obtain 14 bits of resolution of a 250 MhZ input signal having a band width of 25 MhZ.

In accordance with the invention, the phase noise $n_f(t)$ produced by the clock signal is effectively reduced by employing a sin DAC for the feedback DAC 13. The sin DAC reduces the effect of clock jitter as it is based on a pulse shaping concept where the conversion of data has a reduced sensitivity to the effects of clock jitter on data transistions.

Figure 4:
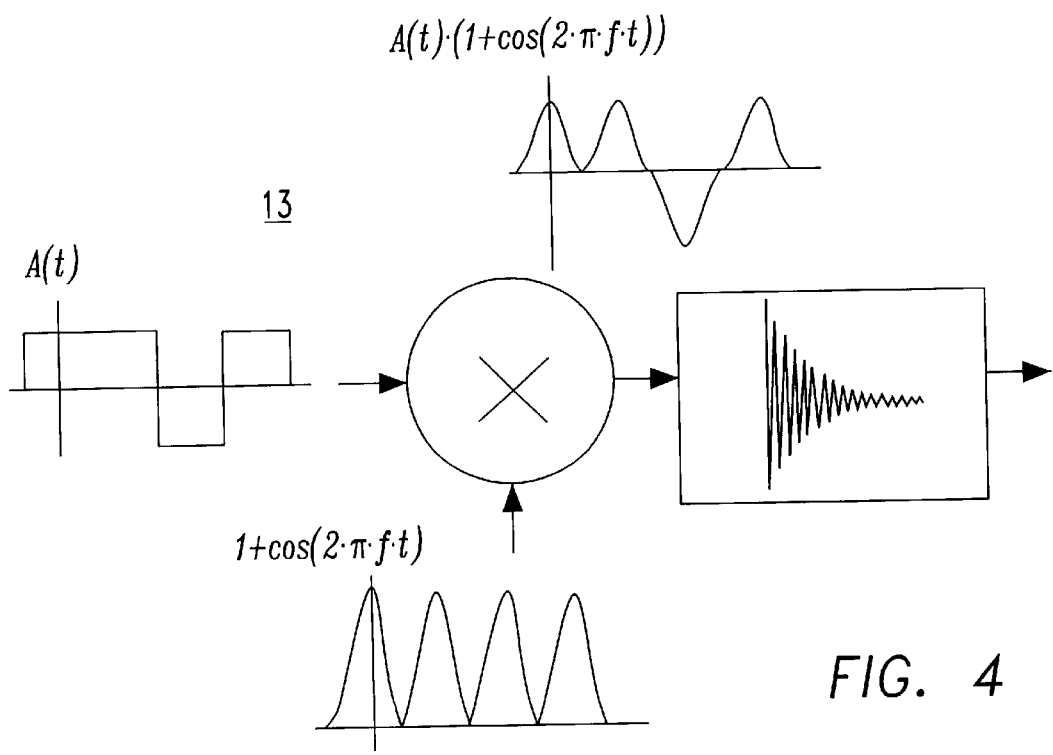
FIG. 4 illustrates sin DAC architecture which may be used as the feedback DAC.

The architecture for a sin DAC is illustrated in FIG. 4. The input digital signal A(t) is multiplied by a cosine function having a DC level associated with it. During positive transitions of the data signal A(t) an output signal is produced having the level:

$1+\cos(2\cdot\pi\cdot f\cdot t)$, and during the negative transitions of the data, an output is produced equal to $-1-\cos(2\cdot\pi\cdot f\cdot t)$ The benefits of the sin DAC are realized by changing the output signal in response to a data transition only when the slope of the cosine function is essentially zero.

FIG. 5 illustrates the benefits of generating an analog signal from the input signal A(t) using the sin DAC. The error energy 29 due to the clock signal jitter on data received by the feedback DAC 13 .is significantly reduced from the error energies of the jitter 30 in the clock signal. As the area 29 is reduced compared to area 30, the phase noise generated from the clock signal jitter is correspondingly reduced.

A more detailed illustration of the sin DAC architecture is shown in FIG. 6. For simplicity, the sin DAC is illustrated as a single bit input device. A first pair of transistors 32 and 33 receive opposite phase signals from a sine wave signal source on their respective base connections. Transistors 32 and 33 have respective current sources 34 and 36 and a emitter regeneration resistor 38. The collectors of each of transistors 32 and 33 produce the opposite phase sine signal. A DC level of 1, -1 is added to each of the sine signals by the collectors of transistors 44, 45 which constitute an offset generator. Transistors 44 and 45 are each connected to a respective DC offset voltage 40, 41 for biasing the two out of phase sine waves to +1 and -1 respectively.

Switching transistors 51 and 52 supply one or the other of the biased sine (cosine) signals to an output terminal taken at the junction of collector resistors 55 and 56 of transistors 52 and 51.

As can be seen from FIG. 5, the output is only switched at the point in which the two cosine functions are at zero slope producing a minimum amount of energy due to phase jitter of the clock signal. The entered clock signal of the coarse DAC 14 is in turn maintained synchronized in circuitry (not shown) with the reference sin wave applied to transistors 32 and 33 to maintain clock phase transitions and the corresponding digital data transitions as-close as possible to the zero slope functions of each cosine function.

Figure 7:
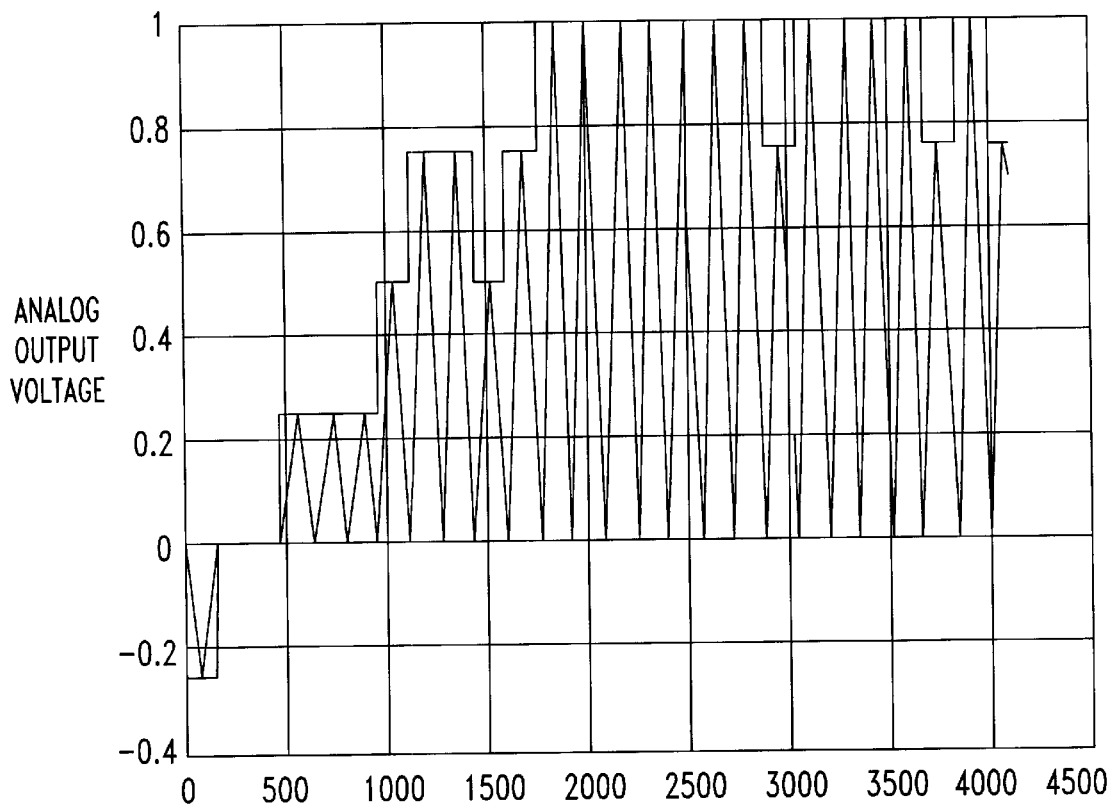
FIG. 7 illustrates the response of an RZ sin DAC to a digital signal.

The resulting output signal for a representative input digital signal shown in FIG. 7. For each signal level, representing a value of digital data, the output comprises multiple return to zero swings of a sinusoidal signal. As the data changes from a low digital value to a higher digital value, larger voltage swings occur in the output signal of the sin DAC due to its return to zero nature. While the sin DAC can provide for a lowering of the noise floor due to phase jitter, a significant problem occurs due to the nonlinearities in the summing junction 11 of the CT delta-sigma ADC. Unless the summing junction can maintain linearity over the large voltage swings produced at the output sin DAC, signal artifacts will be produced within the frequency band of the signal being digitized.

Figure 8:
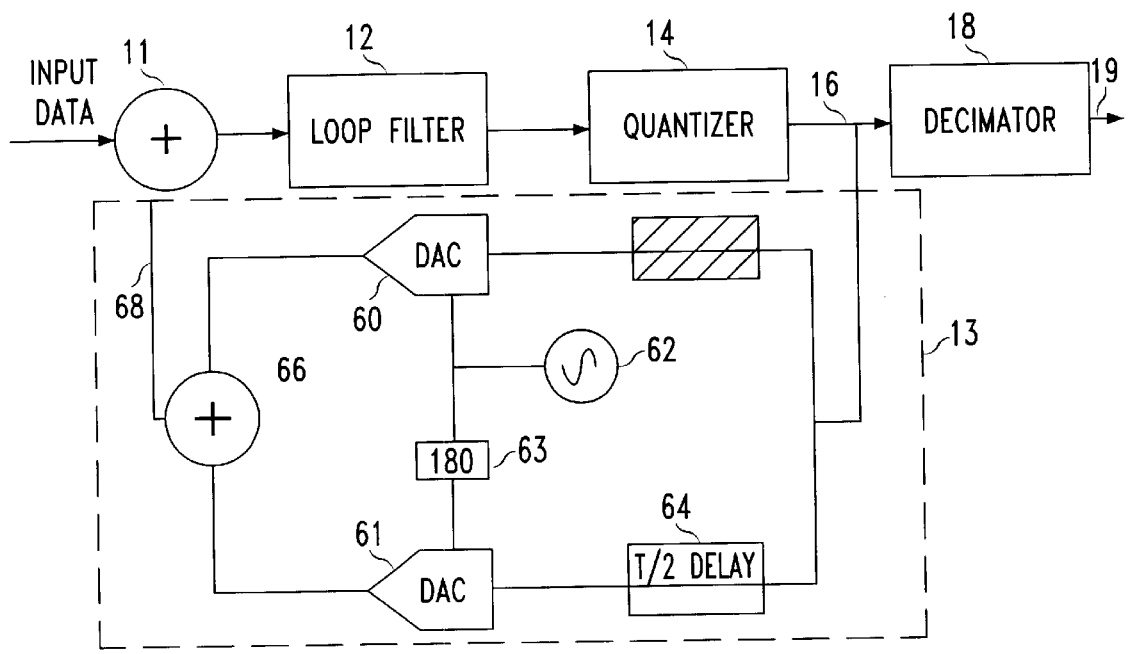
FIG. 8 is a block diagram illustrating the NRZ sin DAC used in the preferred embodiment of the invention.

The disadvantages of the large voltage swings can be minimized by implementing a non-return to zero (NRZ) sin DAC in accordance with FIG. 8. The NRZ implementation will provide a lower phase noise similar to that of the RZ sin DAC, as well as a feedback voltage which tracks the input signal from a reduction of the large voltage excursions. Further, as illustrated in FIG. 7, the feedback signal of the RZ sin DAC includes significant high frequency content due to the return to zero characteristic of the analog output signal. A non-return to zero sin DAC will significantly reduce this high frequency content.

FIG. 8 illustrates one embodiment of a NRZ sin DAC implemented in the CT sigma-delta ADC according to the invention. Like reference numbers are used to identify like components described with respect to the previous figures. The feedback DAC 13 is implemented as a combination of RZ sin DACs 60 and 61. A source of sinusoidal voltage is provided by sine source 62 which is phase shifted by 180° in delay circuit 63. The shifted version of the sin signal is applied to DAC 61, and the unshifted sin signal is applied to DAC 60. Additionally, a delay circuit 64 provides a half clock period delay T/2 to the input digital signal applied to DAC 61. Delay T/2 corresponds to one-half a clock signal for the digital signal 16. The outputs of each of the RZ DACs 60 and 61 are combined in a summing junction 66.

Figure 10:
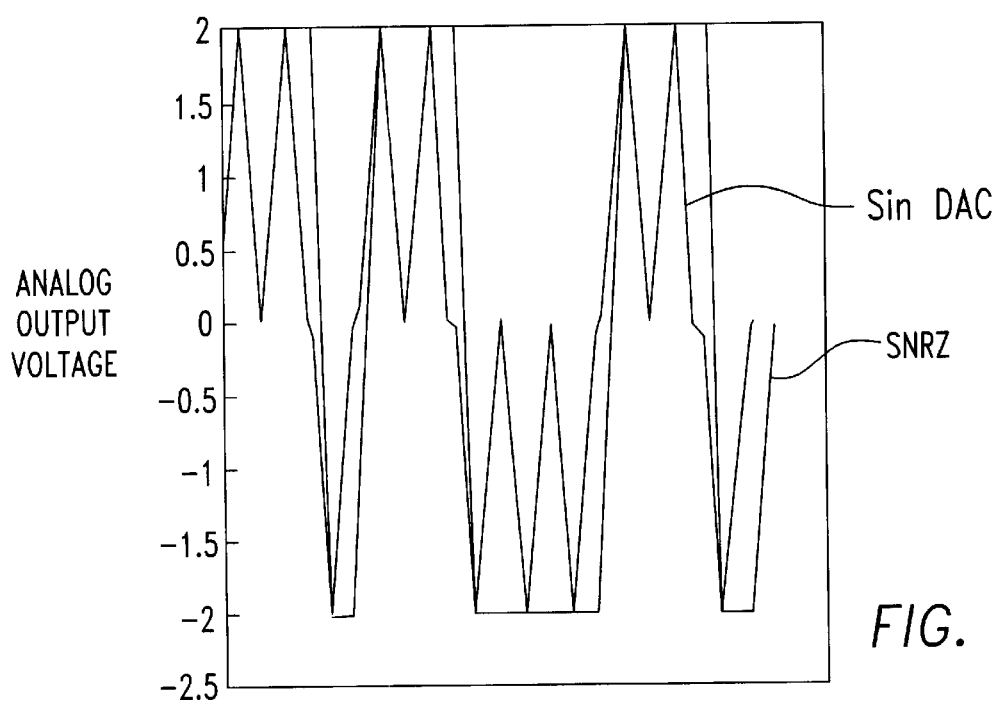
FIG. 10 illustrates the composite output signal of the NRZ sin DAC of FIG. 8.
Figure 9:
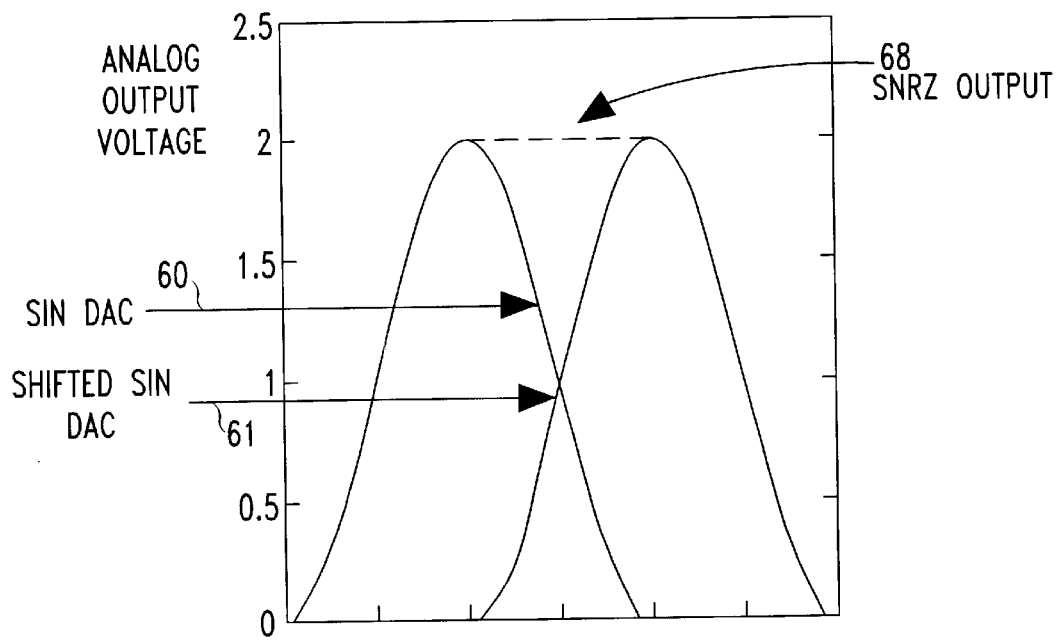
FIG. 9 illustrates the combined output derived from two RZ sin DACs to obtain an NRZ signal.

FIG. 9 illustrates the NRZ signal produced from summing junction 66, which is a composite output of the sin DAC 60, and the sin DAC 61 having an output voltage which is shifted 180° from sin DAC 60. The result is a composite signal which does not return to zero except during data transitions, when it is switched due to a change in data. The difference between the output of the RZ sin DAC and the NRZ sin DAC of FIG. 8 is illustrated in FIG. 10. The elimination of the sinusoidal voltage swings when there is no data change, produces a signal having less phase noise during the time no data is transitioning, a feedback signal having a lower high frequency content and an error voltage produced from summing junction 11 which is smaller since the input signal tracks the feedback signal very closely. Linearity requirements imposed on the summing junction 11 are therefore correspondingly relaxed without increasing the generation of signal artifacts.

Figure 11:
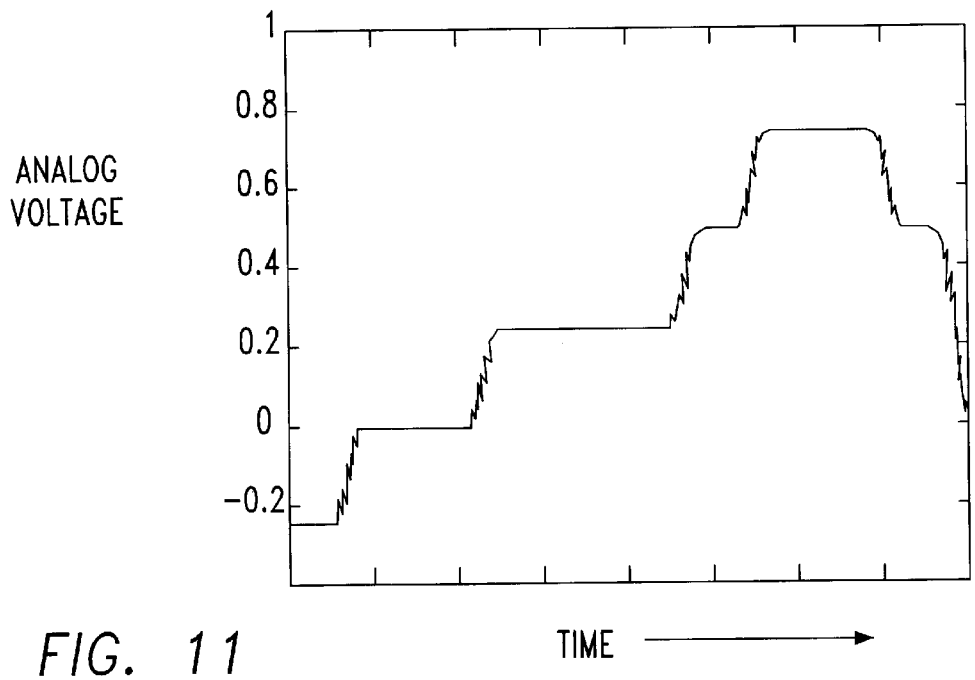
FIG. 11 illustrates the phase noise generated by data transitions on the output of the NRZ sin DAC of FIG. 8.
Figure 12:
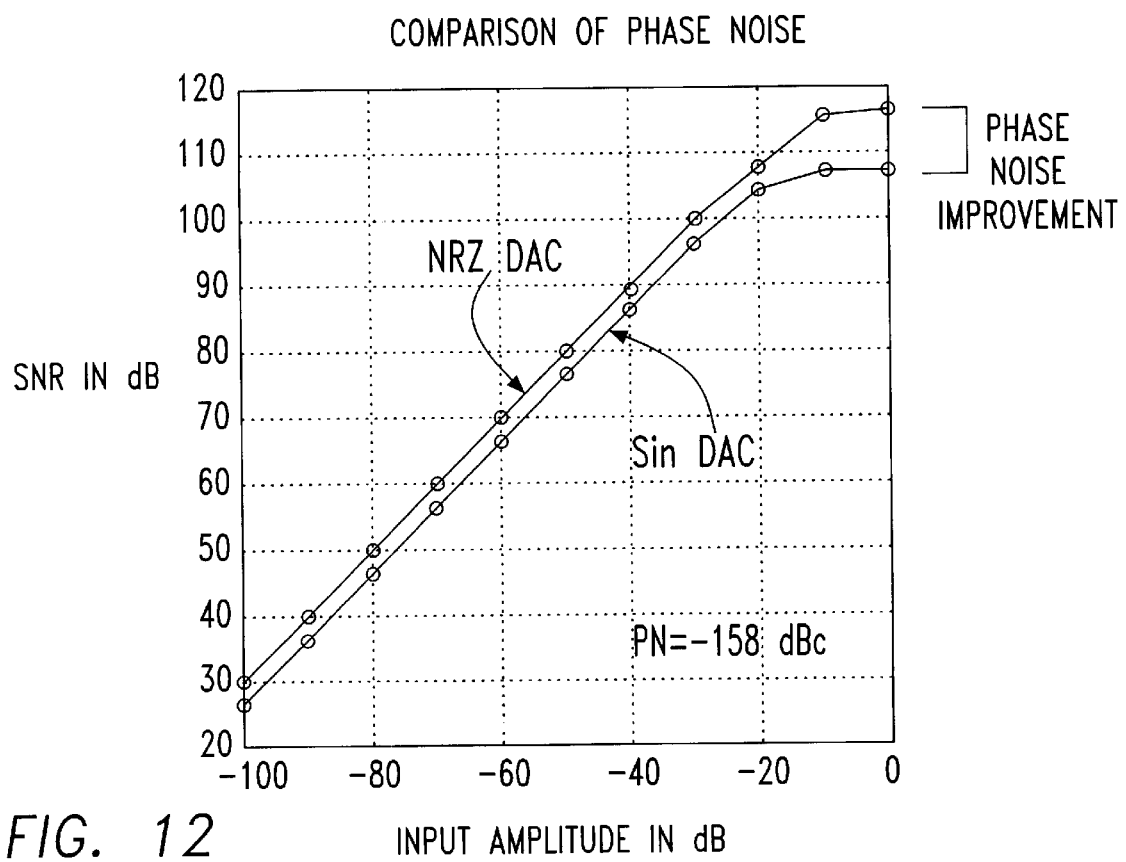
FIG. 12 illustrates the relative difference in noise between the RZ SIN DAC and NRZ SIN DAC.

The specific phase noise improvement obtained using the NRZ sin DAC for the feedback DAC is shown in FIG. 11. As FIG. 11 shows, the only significant phase noise is generated when data transitions from one value to another. During the time between data transitions, the phase noise is effectively cancelled, ultimately lowering the noise floor the digital signal produced by the course DAC 14. FIG. 12 provides a comparison between the NRZ sin DAC and RZ sin DAC. The higher signal to noise ratio is obtained over the range of input amplitude shown using the NRZ sin DAC.

The fact that the NRZ sin DAC has a noise response limited to data transitions can be demonstrated below:

For a data input of a(t)=1, the output equals:

$$1 + \cos(2\pi ft + \phi_1)$$

where $\phi_I$ is the phase noise.

For a data input of a(t)=−1, the output equals:

$$-1 - \cos((2\pi ft + \phi_1)).$$

When there is no transition, the output for NRZ sin DAC equals:

$$1+\cos(2\pi ft+\phi_1)+1+\cos(2\pi ft+\phi_1+\pi)=2'$$

The phase noise gets cancelled because there is a 180° ($\pi$) phase shift between sin DACs 60, 61.

When there is a data transition, $$1+\cos(2\pi ft+\phi_1)-(1+\cos(2\pi ft+\phi_1+\pi)) = 2\cos(2\pi ft+\phi_I),$$

and the phase noise gets doubled.

In a multibit DAC, however, the probability of transition is low since the number of bits having a transition is much lower, resulting in the phase noise improvement.

Delay circuit 64 may be implemented, as will be recognized by those skilled in the art, by having two d-flip flops imposed on the inputs of DAC 60 and 61, one being toggled by the clock signal of DAC 14, and the other being toggled by the inverted clock signal.

The foregoing description of the invention illustrates and describes the present invention. Additionally, the disclosure showes and describes only the preferred embodiments of the invention, but is to be understood that the invention of capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed hererin. Also, it is intended that the appended claims be construed to include alternative embodiments.

What is claimed is:

1. A continuous time delta sigma analog to digital converter comprising:

a summing junction for receiving an analog signal and a feedback signal;

a loop filter connected to receive a combined signal from said summing junction;

a multibit analog to digital converter connected to receive a signal from said loop filter, and a non return to zero sin DAC connected to receive a multibit signal from said analog to digital converter, and to provide a feedback signal to said loop filter, said non return to zero sin DAC producing a linear output signal having reduced phase noise; which produces a lower noise floor for said multibit signal in a frequency bandwidth of an input signal to said summing junction.

2. The continuous time delta sigma analog to digital to analog converter according to claim 1 wherein said non return to zero sin DAC comprises:

a first return to zero sin DAC;

a second return to zero sin DAC having an output connected to an output of said first return to zero sin DAC, said second return to zero sin DACs having output signals delayed from said first sine DAC output signal; and means for applying said digital signal to said first return to zero DAC, and a delayed version to said second return to zero sin DAC; whereby said combined outputs of said first and second non-return to zero DACs produce a non return to zero signal having reduced phase noise between data transitions.

3. The continuous time delta sigma analog to digital converter according to claim 2 wherein said non return to zero sin DAC's have outputs which are delayed by 180° degrees.

4. The continuous time delta sigma analog to digital converter according to claim 1 wherein said non return to zero sin DAC comprises:

a multiplicity of return to zero sin DACs having phase shifted output signals which are combined to produce a non return to zero output signal.

5. A continuous time delta sigma analog to digital converter according to claim wherein means are provided for applying said digital signal at different delay times to said multiplicity of return to zero DACs.

6. A continuous time delta sigma analog to digital converter according to claim wherein said means for applying said digital signals provides one clock signal period between digital signals applied to said return to zero sin DACs.

7. The continuous time delta sigma analog to digital converter according to claim 1 further comprising a decimation filter connected to said analog to digital converter output for producing a digital signal having a higher resolution bit signal.

8. The continuous time delta sigma analog to digital converter according to claim 1 wherein said loop filter is a low pass filter.

9. A method for converting high frequency analog signals to digital signals with a minimum increase in noise floor comprising:

combining said analog signals with a feedback signal;

filtering said analog signals with an analog filter;

converting said analog signals to a multibit digital signal;

re-converting said multibit digital signal into an analog signal using a non return to zero sin DAC to minimize phase jitter in said analog signal whereby a feedback signal is produced which combines with said analog signal.

10. The method according to claim 9 wherein said signal is filtered with a low pass filter function.

11. The method according to claim 9 wherein said signal is filtered with a bandpass filter function.

* * * * *